(12) United States Patent
Mahoney et al.

(10) Patent No.: US 7,815,971 B2
(45) Date of Patent: *Oct. 19, 2010

(54) METHOD FOR MAKING NANOSTRUCTURES WITH CHROMONICS

(75) Inventors: Wayne S. Mahoney, St. Paul, MN (US); Hassan Sahouani, Hastings, MN (US); Roxanne A. Boehmer, Inver Grove Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 730 days.

This patent is subject to a terminal disclaimer.

(21) Appl. No.: 11/626,456

(22) Filed: Jan. 24, 2007

(65) Prior Publication Data

US 2007/0172582 A1 Jul. 26, 2007

Related U.S. Application Data

(60) Provisional application No. 60/743,175, filed on Jan. 26, 2006.

(51) Int. Cl.
*B05D 5/00* (2006.01)
(52) U.S. Cl. .................. 427/256; 524/265; 524/100; 427/372.2; 427/331; 427/337; 427/402; 428/1.1; 252/299.01
(58) Field of Classification Search ............ 524/100, 524/265; 428/1.1; 252/299.01; 427/372.2, 427/256
See application file for complete search history.

(56) References Cited

U.S. PATENT DOCUMENTS

| | | |
|---|---|---|
| 2,801,185 A | 7/1957 | Iler |
| 4,522,958 A | 6/1985 | Das et al. |
| 5,037,579 A | 8/1991 | Matchett |
| 5,639,398 A | 6/1997 | Rhee et al. |
| 5,753,373 A | 5/1998 | Scholz et al. |
| 5,948,487 A | 9/1999 | Sahouani et al. |
| 5,998,487 A | 12/1999 | Brahms et al. |
| 6,329,058 B1 | 12/2001 | Arney et al. |
| 6,432,526 B1 | 8/2002 | Arney et al. |
| 6,488,866 B1 | 12/2002 | Sahouani et al. |

(Continued)

FOREIGN PATENT DOCUMENTS

JP 5715063 A * 3/1981

(Continued)

OTHER PUBLICATIONS

Attwood, T.K., and Lydon, J.E., "Lyotropic Mesophase Formation by Anti-Asthmatic Drugs," Mol. Cryst. Liq. Cryst., Dec. 1984, 108, 349.

(Continued)

*Primary Examiner*—Michael Barr
*Assistant Examiner*—Andrew Bowman
(74) *Attorney, Agent, or Firm*—Stephen L. Crooks

(57) ABSTRACT

Methods of forming nanostructures with chromonic materials are disclosed. A method includes coating a substrate surface with a chromonic solution to form a chromonic layer, removing at least a portion of the water to form a dried chromonic layer, and exposing the dried chromonic layer to an organic solvent to form a pattern of channels within the dried chromonic layer. The chromonic solution includes a chromonic material and water. Materials can be deposited within the channels to form a pattern of nanostructures.

23 Claims, 1 Drawing Sheet

U.S. PATENT DOCUMENTS

| | | | |
|---|---|---|---|
| 6,524,665 | B2 | 2/2003 | Sahouani et al. |
| 6,586,483 | B2 | 7/2003 | Kolb et al. |
| 6,645,578 | B2 | 11/2003 | Sahouani et al. |
| 6,699,533 | B2 | 3/2004 | Sahouani et al. |
| 2002/0150698 | A1* | 10/2002 | Kawabata ............... 428/1.1 |
| 2004/0058091 | A1* | 3/2004 | Dutova et al. ............ 428/1.1 |
| 2006/0063015 | A1 | 3/2006 | McCormick et al. |
| 2006/0110540 | A1* | 5/2006 | Sahouani ............. 427/372.2 |
| 2006/0111482 | A1* | 5/2006 | Sahouani ............... 524/100 |

FOREIGN PATENT DOCUMENTS

| | | |
|---|---|---|
| JP | 361111374 A * | 5/1986 |
| WO | WO 2007/008249 A2 | 1/2007 |
| WO | WO 2007/011417 A2 | 1/2007 |

OTHER PUBLICATIONS

Kawasaki et al., *Langmuir*, 16, 5409 (2000).

Lydon, J., *Colloid and Interface Science*, 8, 480 (2004).

Bonazzi, S. et al., The Self-Assembly and Liquid Crystal Formation of Folic Acid Salts, *Angew. Chem. Int. Ed. Eng.*, 32 248-250 (1993).

Gottarelli, G. et al., The Self-Recognition and Self-Assembly Of Folic Acid Salts in Isotropic Water Solution, *Helv. Chim. Acta.* 1996, 79, 220-234.

Ciuchi, F., et al., Self-Recognition and Assemblly of Folic Acid Salts: Columnar Liquid Crystalline Polymorphism and the Column Growth Process, *J. Am. Chem. Soc.* 1994, 116, 7064-7071.

Ivanisevic, A; Mirkin C.A., *J. Am. Chem. Soc.* 2001, 123(32) 7887-7889, "Dip-Pen" Nanolithography on Semiconductor Surfaces.

Xia, Y.; Whitesides, G.M., *Angew. Chem. Int. Ed.* 1998, 37, 550-575, Soft Lithography.

Hu, J.; Odom, T.W.; Lieber, C.M.; *Acc. Chem. Res.* 1999, 32, 435.

Heath, J.R.; Kuekes, P.J.; Snider, G.S.; Williams, R.S., *Science* 1998, 280, 1716-1721.

Linsenbuhler, M. et al., "An Innovative Dry Powder Coating Process in Non-Polar Liquids Producing Tailor-Made Micro-Particles," *Powder Technology*, vol. 58, Aug. 18, 2005, pp. 3-20.

U.S. Application entitled "Method for Forming Channel Patterns with Chromonic Materials," filed Jun. 27, 2007, having U.S. Appl. No. 11/769,013.

* cited by examiner

METHOD FOR MAKING NANOSTRUCTURES WITH CHROMONICS

PRIORITY CLAIM

This application claims the benefit of U.S. Provisional Application No. 60/743,175, filed Jan. 26, 2006, which is incorporated by reference herein.

BACKGROUND

The present disclosure relates to the field of chromonics. In particular, the present disclosure relates to methods for forming nanostructures using chromonic materials.

Patterned layers of functional materials are used in electric component manufacture as well as other applications. For example, multiple layers of differing patterned layers of such materials are used in the manufactures of flat panel displays, such as liquid crystal displays. Active matrix liquid crystal displays include a plurality of rows and columns of address lines, which cross at an angle to one another, thereby forming a plurality of crossover points.

Lithographic techniques are used to generate small structures; however, as the size domain moves into the nanoscale range, significant technical challenges arise that can limit the use of lithographic techniques for nanostructures.

Another method used to construct nanostructures is self-assembly. Molecular self-assembly is the assembly of molecules without guidance or management from an outside source. Many biological systems use self-assembly to assemble various molecules and structures such as the lipid bilayer membrane in cells, for example.

One useful nanostructure is nanowires. Nanowires represent attractive building blocks for assembly of functional nanoscale devices, and could overcome fundamental and economic limitations of conventional lithography-based fabrication. Nanowires could offer potential as building blocks for applications in nanoelectronics and photonics.

SUMMARY

The present disclosure relates to methods for forming nanostructures using chromonic materials. A first method includes coating a substrate surface with a chromonic solution to form a chromonic layer. The chromonic solution includes a chromonic material and water. The method further includes removing at least a portion of the water from the chromonic layer to form a dried chromonic layer, and exposing the dried chromonic layer to an organic solvent to form a pattern of channels within the dried chromonic layer.

Another method includes coating a substrate surface with a first chromonic solution to form a first chromonic layer. The chromonic solution includes a chromonic material and water. The method further includes removing at least a portion of the water from the first chromonic layer to form a first dried chromonic layer, exposing the first dried chromonic layer to a first organic solvent to form a first pattern of channels within the first dried chromonic layer, disposing a first deposition material within the first pattern of channels to form a first pattern of nanostructures, and removing the first dried chromonic layer from the substrate surface to form a first nanostructured substrate. The method further includes coating the first nanostructured substrate with a second chromonic solution to form second chromonic layer. The second chromonic solution includes a second chromonic material and water. After forming the second chromonic layer, the method further involves, removing at least a portion of the water from the second chromonic layer to form a second dried chromonic layer, exposing the second dried chromonic layer to a second organic solvent to form a second pattern of channels within the second dried chromonic layer, disposing a second deposition material within the second pattern of channels to form a second pattern of nanostructures, and removing the second dried chromonic layer from the substrate surface to form a second nanostructured substrate.

BRIEF DESCRIPTION OF THE DRAWINGS

The disclosure may be more completely understood in consideration of the following detailed description of various embodiments in connection with the accompanying drawings, in which.

Figure 1:
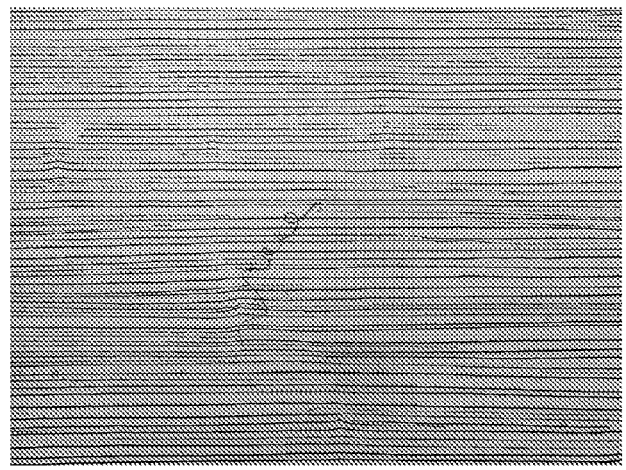
FIG. 1 is an optical micrograph showing a plurality of gold nanowires on the surface of the glass slide formed by the methods described herein.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Methods for the production of an array or pattern of channels and a pattern of nanostructures on a substrate surface are described. The patterns of channels and nanostructures are prepared using chromonic materials. More specifically, channels can be formed within a layer containing chromonic materials via chemical treatment. The channels are voids within the layer and often defined by chromonic material sidewalls and a substrate bottom surface. The pattern of channels can include a plurality of parallel or substantially parallel channels. Deposition materials can be deposited within the channels to form a pattern of nanostructures. The pattern of nanostructures can include a plurality of parallel or substantially parallel nanostructures. Then, the chromonic layer can be selectively removed, leaving the plurality of parallel or substantially parallel nanostructures. The methods described herein provides a coating process to form nanostructures, thus it is now possible to produce these nanostructures over a relatively large surface area in an economic manner.

For the following defined terms, these definitions shall be applied, unless a different definition is given in the claims or elsewhere in this specification.

The term "chromonic materials" (or "chromonic compounds") refers to multi-ring molecules typically characterized by the presence of a hydrophobic core surrounded by various hydrophilic groups (see, for example, Attwood, T. K., and Lydon, J. E., *Molec. Crystals Liq. Crystals*, 108, 349 (1984)). The hydrophobic core can contain aromatic and/or non-aromatic rings. When in solution, these chromonic materials tend to aggregate into a nematic ordering characterized by a long-range order.

The term "nanostructure" refers to a structure having a height and width that is less than 1 micrometer.

The recitation of numerical ranges by endpoints includes all numbers subsumed within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

Unless otherwise indicated, all numbers expressing quantities of ingredients, measurement of properties and so forth used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

Any chromonic material can be useful in the methods described herein. Compounds that form chromonic phases are known in the art, and include, for example, dyes (for example, azo dyes and cyanine dyes) and perylenes (see, for example, Kawasaki et al., *Langmuir*, 16, 5409 (2000), or Lydon, J., *Colloid and Interface Science*, 8, 480 (2004)). Representative examples of useful chromonic materials include di- and mono-palladium organyls, sulfamoyl-substituted copper phthalocyanines, and hexaaryltryphenylene, folic acid (see for example, Bonazzi et al., *Angew. Chem. Int. Ed. Eng.*, 32 248 (1993)), cromolyn sodium salt, and derivatives thereof.

In many embodiments, the chromonic material or chromonic molecule is a nonpolymeric molecule containing more than one carboxy functional group that can associate with mono- or multi-valent cations. The carboxy groups may be directly attached to an aromatic (e.g., carboxyphenyl) or heteroaromatic functional group, however this is not required. When the chromonic molecule has more than one aromatic or heteroaromatic functional group, the carboxy groups are typically arranged such that each aromatic or heteroaromatic group has no more than one carboxy group directly attached.

In some embodiments, the chromonic molecule contains at least one formal positive charge. For example, the chromonic molecule may be zwitterionic, that is, carrying at least one formal positive and at least one formal negative charge. In some chromonic molecules, the negative charge is carried by an acidic group having a dissociated hydrogen atom such as a carboxy group in its basic form, (i.e., —COO⁻). The negative charge can be carried by multiple carboxy functional groups present, such that a proper representation of the chromonic molecule has two or more resonance structures, or structural isomers.

In some embodiments, the chromonic molecules include triazine derivatives with the structure below in Formula I.

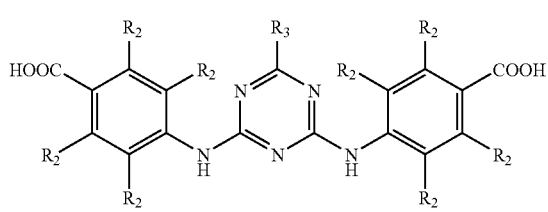

(I)

The compounds of Formula I have an orientation of the carboxy (—COOH) group that is para with respect to the amino linkage to the triazine center of the compound. As depicted above the chromonic molecule is neutral, but it may exist in alternative forms, such as a zwitterion or proton tautomer, for example where a hydrogen atom is dissociated from one of the carboxy groups and is associated with one of the nitrogen atoms in the triazine ring or with one of the amino linkages. The chromonic molecule may also be a salt. The carboxy group may also be meta with respect to the amino linkage, as shown in Formula II below (or may be a combination of para and meta orientations, which is not shown).

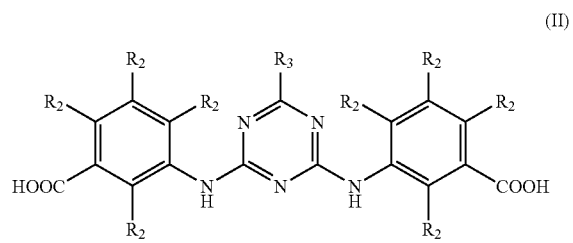

(II)

Each $R_2$ is independently selected from any electron donating group, electron withdrawing group and electron neutral group. In many embodiments, $R_2$ is hydrogen, a substituted or unsubstituted alkyl group, a substituted or unsubstituted alkoxy group (i.e., an alkoxy group is of formula —OR where R is an alkyl), or a substituted or unsubstituted carboxyalkyl group (i.e., a carboxyalkyl group is of formula —(CO)OR where (CO) denotes a carbonyl and R is an alkyl). Suitable substituents include hydroxy, alkoxy, carboxyalkyl, sulfonate, or halide functional groups. In one embodiment, $R_2$ is hydrogen.

Group $R_3$ may be selected from the group consisting of: substituted heteroaromatic rings, unsubstituted heteroaromatic rings, substituted heterocyclic rings, and unsubstituted heterocyclic rings, that are linked to the triazine group through a nitrogen atom within the ring of $R_3$. $R_3$ can be, but is not limited to, heteroaromatic rings derived from pyridine, pyridazine, pyrimidine, pyrazine, imidazole, oxazole, isoxazole, thiazole, oxadiazole, thiadiazole, pyrazole, triazole, triazine, quinoline, and isoquinoline. In many embodiments, $R_3$ includes a heteroaromatic ring derived from pyridine or imidazole. A substituent for the heteroaromatic ring $R_3$ may be selected from, but is not limited to, any of the following substituted and unsubstituted groups: alkyl, carboxy, amino, alkoxy, thio, cyano, carbonylaminoalkyl (i.e., a group of formula —(CO)NHR where (CO) denotes a carbonyl and R is an alkyl), sulfonate, hydroxy, halide, perfluoroalkyl, aryl, alkoxy, and carboxyalkyl. In many embodiments, the substituent for $R_3$ is selected from alkyl, sulfonate, carboxy, halide, perfluoroalkyl, aryl, alkoxy, and alkyl substituted with hydroxy, sulfonate, carboxy, halide, perfluoroalkyl, aryl, and alkoxy. In one embodiment, $R_3$ is derived from a substituted pyridine with the substituent being preferably located at the 4-position. In another embodiment, $R_3$ is derived from a substituted imidazole with the substituent being preferably located at the 3-position. Suitable examples of $R_3$ include, but are not limited to: 4-(dimethylamino)pyridium-1-yl, 3-methylimidazolium-1-yl, 4-(pyrrolidin-1-yl)pyridium-1-yl, 4-isopropylpyridinium-1-yl, 4-[(2-hydroxyethyl)methylamino]pyridinium-1-yl, 4-(3-hydroxypropyl)pyridinium-1-yl, 4-methylpyridinium-1-yl, quinolinium-1-yl, 4-tert-butylpyridinium-1-yl, and 4-(2-sulfoethyl)pyridinium-1-yl, shown in Formulae IV to XIII below. Examples of heterocyclic rings that $R_3$ may be selected from include, for example, morpholine, pyrrolidine, piperidine, and piperazine.

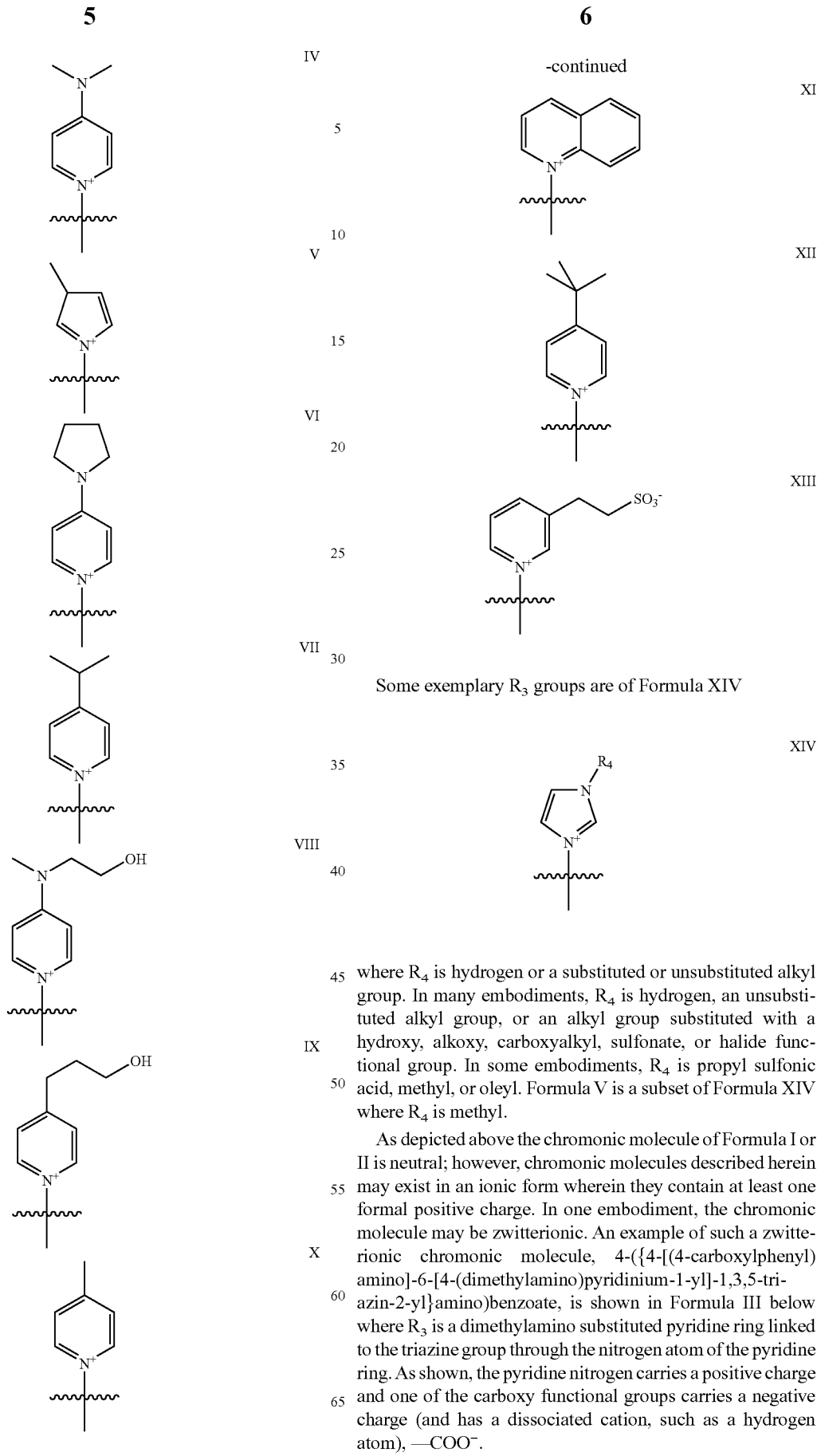

Some exemplary $R_3$ groups are of Formula XIV where $R_4$ is hydrogen or a substituted or unsubstituted alkyl group. In many embodiments, $R_4$ is hydrogen, an unsubstituted alkyl group, or an alkyl group substituted with a hydroxy, alkoxy, carboxyalkyl, sulfonate, or halide functional group. In some embodiments, $R_4$ is propyl sulfonic acid, methyl, or oleyl. Formula V is a subset of Formula XIV where $R_4$ is methyl.

As depicted above the chromonic molecule of Formula I or II is neutral; however, chromonic molecules described herein may exist in an ionic form wherein they contain at least one formal positive charge. In one embodiment, the chromonic molecule may be zwitterionic. An example of such a zwitterionic chromonic molecule, 4-({4-[(4-carboxylphenyl)amino]-6-[4-(dimethylamino)pyridinium-1-yl]-1,3,5-triazin-2-yl}amino)benzoate, is shown in Formula III below where $R_3$ is a dimethylamino substituted pyridine ring linked to the triazine group through the nitrogen atom of the pyridine ring. As shown, the pyridine nitrogen carries a positive charge and one of the carboxy functional groups carries a negative charge (and has a dissociated cation, such as a hydrogen atom), —COO⁻.

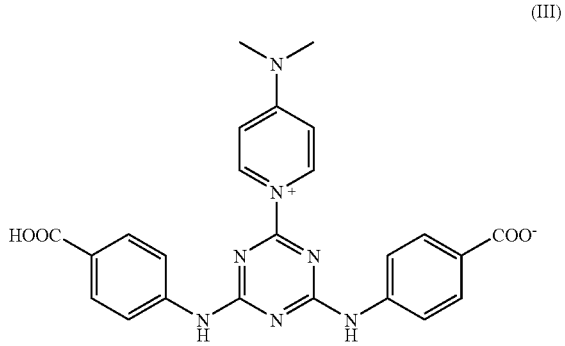

(III)

The chromonic molecule shown in Formula III may also exist in other tautomeric forms, such as where both carboxy functional groups carry a negative charge and where positive charges are carried by one of the nitrogen atoms in the triazine group and the nitrogen on the pyridine group.

As described in U.S. Pat. No. 5,948,487 (Sahouani, et al.), triazine derivatives with Formula I may be prepared as aqueous solutions, or may be prepared as salts which can later be re-dissolved to form an aqueous solution. A typical synthetic route for the triazine molecules shown in Formula I above involves a two-step process. Cyanuric chloride is treated with 4-aminobenzoic acid to give 4-{[4-(4-carboxyanilino)-6-chloro-1,3,5-triazin-2-yl]amino}benzoic acid. This intermediate is treated with a substituted or unsubstituted nitrogen-containing heterocycle. The nitrogen atom of the heterocycle displaces the chlorine atom on the triazine to form the corresponding chloride salt. The zwitterionic derivative, such as that shown in Formula III above, is prepared by dissolving the chloride salt in ammonium hydroxide and passing it down an anion exchange column to replace the chloride with hydroxide, followed by solvent removal. Alternative structures, such as that shown in Formula II above, may be obtained by using 3-aminobenzoic acid instead of 4-aminobenzoic acid.

These molecules are capable of forming a chromonic phase or assembly when dissolved in an aqueous solution, which may or may not be alkaline. Chromonic phases or assemblies are known and contain stacks of flat, multi-ring molecules. The molecules have a hydrophobic core surrounded by hydrophilic groups. The stacking takes on a number of morphologies, but is typically characterized by a tendency to form columns created by a stack of layers. Ordered stacks of molecules are formed that grow with increasing concentration, but they are distinct from micellar phases, in that they generally do not have surfactant-like properties and do not exhibit a critical micellar concentration. In many embodiments, the chromonic phases will exhibit isodesmic behavior. That is, addition of molecules to the ordered stack leads to a monotonic decrease in free energy. The chromonic M phase (i.e., hexagonal phase) typically is characterized by ordered stacks of molecules arranged in a hexagonal lattice. The chromonic N phase (i.e., nematic phase) is characterized by a nematic array of columns, that is, there is long range ordering along the columns characteristic of a nematic phase, but there is little or no ordering amongst the columns, thus it is less ordered than the M phase. The chromonic N phase typically exhibits a schlieren texture, which is characterized by regions of varying index of refraction in a transparent medium.

In many embodiments, the chromonic material is placed in ab aqueous solution in the presence of one or more pH-adjusting compounds and an optional surfactant. The addition of pH-adjusting compounds often allows the chromonic material to become more soluble in aqueous based solvents (i.e., water and an optional water miscible solvent). Suitable pH-adjusting compounds include any known base such as, for example, ammonium hydroxide or various amines. The optional surfactant can be added to the aqueous solution to promote wetting of the solution onto the surface of a substrate. Suitable surfactants include ionic and non-ionic surfactants (preferably, non-ionic). Optional additives such as viscosity modifiers (for example, polyethylene glycol) and/or binders (for example, low molecular weight hydrolyzed starches) can also be added. In some embodiments, one or more organic solvents are added to the solution. These organic solvents can be added to the solution to achieve an organic solvent concentration in the range of 0.1 to 10 (or 1 to 10) percent by weight of the solution.

The chromonic materials can be dissolved in the aqueous solution at a temperature less than about 40° C. (or at room temperature). The relative concentrations of each of the components in the aqueous chromonic solution will vary with the desired orientation of the resulting nanostructures and their intended application. Generally, however, the chromonic material will be added to the solution to achieve a concentration in the range of 4 to 20 (or 4 to 8) percent by weight of the solution.

The aqueous chromonic solution can be mixed with a non-chromonic phase including an organic, water-soluble molecule that forms a homogenous phase with the chromonic material. In some embodiments, the water-soluble molecule is a saccharide such as a monosaccharide, disaccharide, trisaccharide, or polysaccharide. For example, the water soluble molecule can include polysaccharides such as starch, corn starch, amylopectin, maltodextrins, or corn syrup solids. Alternatively, the water soluble molecule can include a monosaccharide such as glucose or fructose, and disaccharides such as sucrose, maltose, or lactose. The water soluble molecule can be present in any useful amount. In many embodiments, the water soluble molecule is present in the aqueous chromonic solution at a range of 1 to 50 wt % of total aqueous chromonic solution.

The resulting chromonic solution can be applied to or coated onto a surface of a substrate. Suitable substrates include any solid materials that will accept the application of the chromonic solution such as, for example, flexible polymer films (such as poly(ethylene terephthalate), polyimide, polyolefins, and cellulose acetate), rigid substrates (such as polycarbonate, glass or silicon wafers), and metallic films (such as aluminum or nickel foil).

The substrates can be treated with a primer to facilitate coating of the chromonic solution. The primer can also improve wetting of the substrate with the chromonic solution or to improve the adhesion of the chromonic solution to the substrate. Suitable primers includes, for example, an inorganic oxide coating as described in U.S. Pat. No. 5,753,373. Other methods of priming the substrate include plasma treatment such as corona treatment and oxygen glow discharge.

The chromonic solution can be applied by any useful means that provides for the ordered arrangement of the chromonic materials within the chromonic layer. Suitable coating techniques include, for example, roll coating, die coating, dip coating, spray coating, knife coating, or curtain coating. In some embodiments, shear orientation or magnetic orientation can be applied to the chromonic layer either during or after application to the surface of the substrate. The application of shear or magnetic force to the chromonic layer can help promote alignment of the chromonic materials such that, upon removal of at least a portion of the water, the dried chromonic layer has an oriented structure or matrix. In many embodiments, the alignment of the chromonic materials is in the direction of the applied force during the coating process.

The chromonic solution can be applied to the substrate at any useful wet coating thickness. In many embodiments, the chromonic solution is applied to the substrate at a uniform wet coating thickness in a range from 1 to 25 micrometers. In some embodiments, the chromonic solution is applied to the substrate at a uniform wet coating thickness in a range from 1 to 15 micrometers. In some embodiments, the chromonic solution is applied to the substrate at a uniform wet coating thickness in a range from 1 to 10 micrometers. In further embodiments, the chromonic solution is applied to the substrate at a uniform wet coating thickness in a range from 1 to 5 micrometers.

At least a portion of the water is removed from the chromonic layer to form a dried chromonic layer. That is, as used herein, the term "dried chromonic layer" refers to a chromonic layer that has been at least partially dried. Drying of the coated chromonic layer can be achieved using any means suitable for drying aqueous coatings. Useful drying methods will not damage the coating or significantly disrupt the orientation of the coated chromonic layer imparted during coating or application. In some embodiments water is removed from the chromonic layer via evaporation with or without the application of heat to the chromonic layer to form a dried chromonic layer.

In many embodiments, at least 10% wt of water (based on the total weight of the coating) is removed from the chromonic layer to form the dried chromonic layer. In some embodiments, at least 25% wt of water (based on the total weight of the coating) is removed from the chromonic layer to form the dried chromonic layer. In further embodiments, at least 50% wt, or at least 75% wt, or at least 80% wt, or at least 90% wt, or at least 95% wt of water (based on the total weight of the coating) is removed from the chromonic layer to form the dried chromonic layer.

The dried chromonic layer is exposed to an organic solvent to form a pattern of channels within the dried chromonic layer. In many embodiments, the organic solvent does not dissolve chromonic material in the dried chromonic layer. In some embodiments, the organic solvent is a hydrophilic organic solvent. In some embodiments, the organic solvent is an alcohol or an anhydrous alcohol such as anhydrous ethanol. The organic liquid that is applied to the dried chromonic coating can include, for example, alcohols such as ethanol, 1-propanol, 2-propanol, 1-butanol, 2-butanol, or tertiary butanol, and ketones such as acetone, methyl ethyl ketone, cyclopentanone, or cylcohexanone. Other useful organic solvents include, for example, acetonitrile, tetrahydrofuran, methyl tertiary butyl ether, dimethyl carbonate, and diethyl carbonate.

Exposing the dried chromonic layer to an organic solvent often forms a pattern of channels. The channels often have an average channel width in a range from 10 to 800 nanometers, within the dried chromonic layer. In many embodiments, exposing the dried chromonic layer to an organic solvent forms a pattern of channels having an average channel width in a range from 10 to 500 nanometers, in a range from 10 to 300 nanometers, in a range from 10 to 250 nanometers, or in a range from 10 to 200 nanometers, within the dried chromonic layer. In some embodiments, exposing the dried chromonic layer to an organic solvent forms a pattern of channels having an average channel width in a range from 10 to 100 nanometers or in a range from 10 to 50 nanometers, within the dried chromonic layer.

Exposing the dried chromonic layer to an organic solvent forms a pattern of channels having an average channel depth equal to the thickness of the dried coating. In many embodiments, the substrate surface is exposed as the base of the channels. Thus, the channels are often defined by the chromonic sidewalls and the substrate surface. In many embodiments, the depth of the channel is in a range from 500 nanometers to 3 micrometers. In some embodiments, exposing the dried chromonic layer to an organic solvent forms a pattern of channels having an average channel depth in a range from 500 nanometers to 2 micrometers.

The pattern of channels includes a plurality of parallel or substantially parallel channels. Exposing the dried chromonic layer to an organic solvent forms a pattern of channels having an average pitch or period in a range from 500 nanometers to 20 micrometers, within the dried chromonic layer. That is, the channels are separated from each other by a distance in the range from 500 nanometers to 20 micrometers within the dried chromonic layer. In many embodiments, exposing the dried chromonic layer to an organic solvent forms a pattern of channels having an average pitch or period in a range from 500 nanometers to 10 micrometers or in a range from 500 nanometers to 5 micrometers or in a range from 2 micrometers to 15 micrometers, within the dried chromonic layer.

Some exemplary patterns of channels include a plurality of parallel or substantially parallel channels with the channels having an average channel depth in a range from 500 nanometers to 3 micrometers, an average channel width in a range from 10 to 800 nanometers, and an average pitch in a range from 500 nanometers to 20 micrometers. For example, some patterns of channels have an average channel depth in a range from 500 nanometers to 2 micrometers, an average channel width in a range of 100 to 300 nanometers, and an average pitch in a range from 2 to 15 micrometers.

The method of coating the organic solvent on the dried chromonic coating include techniques such as, for example, die coating, dip coating, spray coating, knife coating, or curtain coating, or simply applying the liquid dropwise onto the dried chromonic coating. With dip coating, the substrate containing the dried organic coating can briefly be held in the organic solvent for 1 to 10 seconds, or for 1 to 5 seconds, for example. The organic solvent coating can be applied as a continuous or discontinuous coating or layer to the dried chromonic coating to form a corresponding discontinuous pattern of channels within the dried chromonic layer. A discontinuous organic solvent coating can be applied in any desired pattern using any useful means such as, for example, inkjet coating or flexographic printing.

In some embodiments, heat is applied to the organic solvent to vaporize the organic solvent. Heat can be applied in any useful manner such as, for example, in an oven or with infrared heaters. Useful heating methods do not destroy the chromonic coating or warp the substrate.

A deposition material can be deposited over the surface of the dried chromonic layer and in the channels within the dried chromonic layer. The deposition of material in the channels within the dried chromonic layer can result in the formation of a pattern of nanostructures that are often attached to the surface of the substrate within the channels. The deposition can include, for example, metals, metal oxides, semi-conductors, dielectric materials, and the like.

In many embodiments, a metal material can be disposed within the pattern of channels to form a pattern of metal nanostructures. The metal material within the pattern of channels that form the pattern of metal nanostructures is often attached to the substrate surface. Exemplary deposition materials include, but are not limited to, metals, metal alloys, metal-containing compounds such as organometallic compounds, salts of metals, oxides of metals, and mixtures thereof. In many embodiments, the deposition material includes a metal such as, for example, gold, silver, copper, titanium, iron, or platinum. In one example, the metal is gold. The deposited material can include multiple layers of material such as multiple layers formed by sequentially depositing different deposition materials. In one embodiment, the deposition material is multiple metal layers that can be the same of different. In one example, the deposition material is a gold layer on a titanium layer.

Any useful deposition techniques can be used to apply the deposition material. In some embodiments, deposition materials such as metals can be deposited using vapor deposition techniques and the like. In other embodiments, deposition materials can be applied using solution deposition techniques. For example, the deposition material can be combined with a suitable solvent that does not disturb the integrity of the dried chromonic layer (e.g., the solvent does not dissolve the dried chromic layer). The solution can be applied to the dried chromonic layer and to the channels within this layer.

A coupling agent known to react with metals or metal salts can be applied to the surface of the dried chromonic layer after formation of the channels. Such a coupling agent includes, but is not limited to, a thiol-containing silanol. The deposition material can be applied over the dried chromonic layer after treatment with the coupling agent.

In some embodiments, the channels within the dried chromonic layer can be cleaned before the deposition material is disposed within the pattern of channels. This cleaning step can assist in improving the adhesion, for example, of the deposition material to the substrate within the pattern of channels. Any useful cleaning process can be used that cleans the channels within the dried chromonic channel but does not destroy the chromonic coating or warping the substrate. Useful cleaning processes include plasma treatment methods such as, for example, reactive ion etching, inductively coupled plasma, and the like.

After the deposition material is disposed within the pattern of channels, the dried chromonic layer can be removed from the substrate surface. In many embodiments, the dried chromonic layer is removed from the substrate surface with a solvent that includes water. The deposition material that is not within the channels is typically removed but the deposition material deposited within the channels typically remains attached to the substrate. This remaining deposition material attached to the substrate results in the formation of a patterned nanostructured surface. In many embodiments, the patterned nanostructured surface includes a plurality of parallel or substantially parallel nanostructures. In many embodiments, these nanostructure patterns conduct electricity.

Disposing the deposition material into the pattern of channels forms a pattern of nanostructures having an average nanostructure width in a range from 10 to 800 nanometers. In many embodiments, disposing the deposition material into the pattern of channels forms a pattern of nanostructures having an average nanostructure width in a range from 10 to 500 nanometers, in a range from 10 to 300 nanometers, in a range from 10 to 250 nanometers, or in a range from 10 to 200 nanometers. In some embodiments, disposing the deposition material into the pattern of channels forms a pattern of nanostructures having an average nanostructure width in a range from 100 to 300 nanometers. In many embodiments, these nanostructure patterns conduct electricity.

Disposing the deposition material into the pattern of channels forms a pattern of nanostructures having an average nanostructure height in a range from 10 to 250 nanometers. In many embodiments, disposing the deposition material into the pattern of channels forms a pattern of nanostructures having an average height in a range from 10 to 100 nanometers or in a range from 25 to 75 nanometers. In many embodiments, these nanostructure patterns conduct electricity.

Disposing the metal material into the pattern of channels forms a pattern of nanostructures include a plurality of parallel or substantially parallel nanostructures having an average pitch or period in a range from 500 nanometers to 20 micrometers. In many embodiments, disposing the deposition material into the pattern of channels forms a pattern of nanostructures having an average pitch or period in a range from 500 nanometers to 10 micrometers or in a range from 500 nanometers to 5 micrometers or in a range from 2 micrometers to 15 micrometers. In many embodiments, these nanostructure patterns conduct electricity.

In many embodiments, the methods described herein can be used to form a pattern of nanostructures that includes a plurality of parallel or substantially parallel nanostructures having an average nanostructure height in a range from 10 to 250 nanometers, an average nanostructure width in a range from 10 to 800 nanometers, and an average pitch or period in a range from 500 nanometers to 20 micrometers. For example, the nanostructures can have an average nanostructure height in a range from 25 to 75 nanometers, an average nanostructure width in a range from 100 to 300 nanometers, and a pitch or period in a range from 2 to 15 micrometers. In many embodiments, these nanostructure patterns conduct electricity.

In another aspect, a substrate containing the nanostructures, described above, can be used as the original coating substrate. Application of another chromonic solution to this substrate can produce channels in a direction of the aligned chromonic materials. The channels can be oriented parallel to the direction of the existing nanostructures on the substrate, or at some angle (e.g., orthogonal) relative to the direction of the existing parallel or substantially parallel nanostructures on the substrate. Deposition of material (metal, metal oxide, semi-conductors, dielectric materials) can then produce a grid of overlapping nanostructures. In many embodiments, these overlapping nanostructure patterns conduct electricity.

More specifically, a substrate having multiple patterns of nanostructures can be formed by initially preparing a first nanostructured substrate by coating a substrate surface with a first chromonic solution that contains a first chromonic material and water to form a first chromonic layer, removing at least a portion of the water from the first chromonic layer to form a first dried chromonic layer, exposing the first dried chromonic layer to a first organic solvent to form a first pattern of channels within the first dried chromonic layer, disposing a first deposition material within the first pattern of channels to form a first pattern of nanostructures, and removing the first dried chromonic layer from the substrate surface to form a first nanostructured substrate. The method further includes coating the first nanostructured substrate with a second chromonic solution that contains a second chromonic material and water to form second chromonic layer, removing at least a portion of the water from the second chromic layer to form a second dried chromonic layer, exposing the second dried chromonic layer to a second organic solvent to form a second pattern of channels within the second dried chromonic layer, disposing a second deposition material within the second pattern of channels to form a second pattern of nanostructures, and removing the second dried chromonic layer from the substrate surface to form a second nanostructured substrate. The second nanostructured substrate includes a first pattern of nanostructures and a second pattern of nanostructures.

In some examples of this embodiment, the first pattern of channels includes a first plurality of parallel or substantially parallel channels and the second pattern of channels includes a second plurality of parallel or substantially parallel channels. The first chromonic material and the second chromonic material can be the same or different. The first deposition material and the second deposition material can be the same or different.

In one example, a first dried chromonic layer is formed having a first pattern of parallel or substantially parallel channels in a first longitudinal orientation. A first deposition material can be deposited in this first pattern of channels to form a first pattern of nanostructures having a first longitudinal orientation. After removal of the first dried chromic layer, a second dried chromic layer is formed having a second pattern of parallel or substantially parallel channels in a second longitudinal orientation. A second deposition material can be deposited in this second pattern of channels to form a second pattern of nanostructures having a second longitudinal orientation. In some examples the second longitudinal orientation is parallel or substantially parallel to the first longitudinal orientation. In other examples, the second longitudinal orientation is not parallel or substantially parallel to the first longitudinal orientation. The first and second longitudinal orientations can be, for example, orthogonal to each other or can form any suitable angle to each other. The first and second pattern of nanostructures can have the same or different nanostructure size and/or period as described above.

EXAMPLES

All parts, percentages, ratios, etc. in the examples are by weight, unless specified otherwise. Solvents and other reagents used were obtained from EMD Chemicals Inc., Gibbstown, N.J., or Alfa Aesar of Ward Hill, Mass., unless otherwise noted.

Example 1

A mixture of corn starch (0.26 g; available as ICB 3000 from Tate & Lyle PLC, Decatur, Ill.) in deionized water (4.0 g) was magnetically stirred until the starch was dissolved. A solution of 30 weight percent ammonium hydroxide in water (0.18 g) was then added to the starch mixture, followed by the chromonic compound of Formula III (0.5 g), described above and prepared essentially by the method described in Example 1 of U.S. Pat. No. 6,488,866 (Sahouani et al). This chromic compound is 4-({4-[(4-carboxyphenyl)amino]-6-[4-(dimethylamino)pyridinium-1-yl]-1,3,5-triazin-2-yl}amino)benzoate having the following structure.

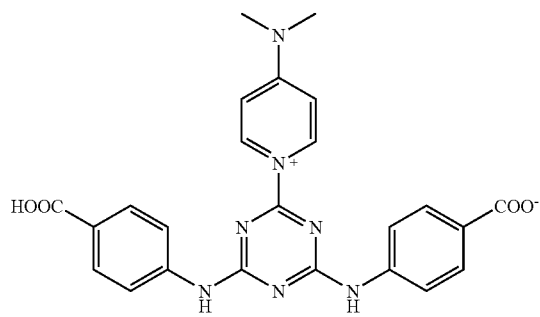

After the chromonic compound was dissolved, four drops of a 10 weight percent solution of GLUCOPON 425N (an alkyl polyglucoside surfactant available from Cognis Corp. USA, Cincinnati, Ohio) was combined with the solution. This solution was then taken up in a 5-milliliter disposable syringe that was then fitted with a 5-micrometer ACRODISC syringe filter having a VERSAPORE membrane (available from Pall Corp., East Hills, N.Y.). It was then discharged from the syringe through the syringe filter into a glass vial. Methyl ethyl ketone (5 drops) was added to the filtered solution and this solution was then magnetically stirred for 15 minutes.

Figure 2:
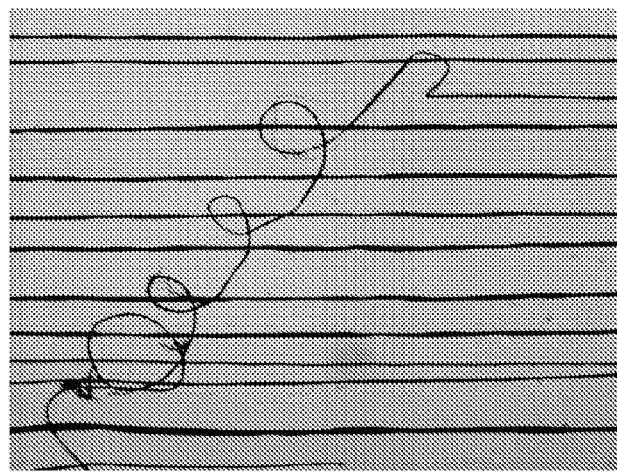
FIG. 2 is another optical micrograph showing a plurality of gold nanowires on the surface of the glass slide formed by the methods described herein.
Figure 3:
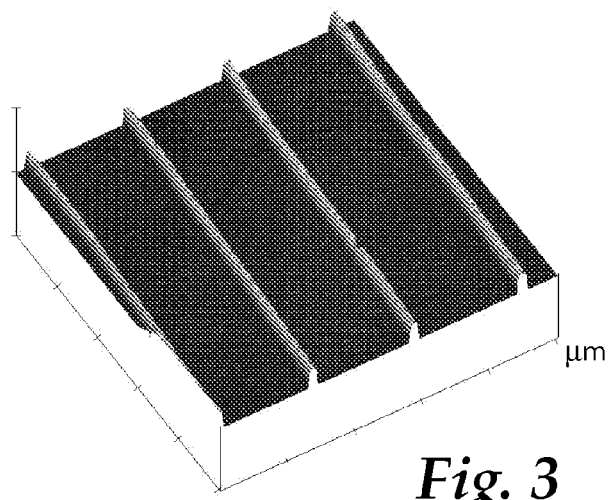
FIG. 3 is an atomic force micrograph of the gold nanowires shown in FIG. 1 and FIG. 2.

The chromonic solution was then coated onto a glass microscope slide (50 mm×75 mm×1 mm, available from Corning Inc., Corning, N.Y.) using a Bird film applicator (0.0127 millimeter (0.0005 inch) gap; available from BYK-Gardner USA, Columbia, Md.). The Bird film applicator was supported at each end by glass microscope slides, and a third glass slide, with a short tab of SCOTCH MAGIC TRANSPARENT TAPE (available from 3M Company, St. Paul, Minn.) attached to one end, was positioned between the two supporting slides. The chromonic solution was applied to the surface of the center glass slide adjacent to the Bird film applicator and the slide was subsequently pulled under the film applicator using the attached tape tab. The chromonic coating on the glass slide was allowed to dry in the air at room temperature for approximately five minutes. Then the coating was covered with a thin layer of 200-proof ethanol (Aaper Alcohol and Chemical Co., Shelbyville, Ky.) that was applied in drops via a pipette. Excess ethanol was removed by placing the coated glass slide in a convection oven at 100° C. for approximately 20 seconds. Metals were deposited sequentially on the coated glass slide by metal evaporation. Titanium was the first metal supplied by heating using an electron beam in a vacuum chamber (at a pressure of less than about 0.533 millipascal (4E-6 torr) to deposit a titanium layer approximately 5 nanometers thick. A layer of gold having a thickness of approximately 60 nanometers was then deposited under the same conditions, in the same vacuum chamber, by heating via high voltage thermal resistance in a tungsten boat. The chromonic coating and the exposed areas of the glass slide were thus coated with metal. The glass slide was then immersed in water, which resulted in the chromonic coating lifting off of the slide. Metal that was deposited on exposed areas of the glass slide remained on the slide. An optical micrograph showing the array of gold nanowires on the surface of the glass slide is shown in FIG. 1 and FIG. 2. The surface of the glass slide was further analyzed by atomic force microscopy (AFM) and a micrograph is shown in FIG. 3. The analysis by AFM showed that the nanowires were approximately 67 nanometers in height and approximately 293 nanometers in width and had a pitch (the distance between nanowires) from about 2 to about 15 micrometers.

Example 2

A mixture of amylopectin (0.13 g., TCI America, Portland, Oreg.) in deionized water (4.0 g) was magnetically stirred until the amylopectin dissolved. A solution of 30 weight percent ammonium hydroxide in water (0.18 g) was added to the amylopectin solution, followed by the chromonic compound of Example 1 (0.5 g). After dissolving the chromonic compound, four drops of a 10 weight percent solution of GLUCOPON 425N (an alkyl polyglucoside surfactant available from Cognis Corp. USA, Cincinnati, Ohio) in water were combined with the solution. The resulting solution was taken up in a 5-milliliter disposable syringe that was fitted with a 5-micrometer ACRODISC syringe filter having a VERSAPORE membrane (available from Pall Corp., East Hills, N.Y.). The solution was discharged from the syringe through the syringe filter into a glass vial. The chromonic solution was coated onto a glass microscope slide (50 mm×75 mm×1 mm, available from Corning Inc., Corning, N.Y.) using a Bird film applicator (0.0127 millimeter (0.0005 inch) gap; available from BYK-Gardner USA, Columbia, Md.). The Bird film applicator was supported at each end by glass microscope slides, and a third glass slide, with a short tab of SCOTCH MAGIC TRANSPARENT TAPE (available from 3M Company, St. Paul, Minn.) attached to one end, was positioned between the two supporting slides. The chromonic solution was applied to the center glass slide adjacent to the Bird film applicator and the slide was subsequently pulled (by the tape tab) under the film applicator. The chromonic coating on the glass slide was allowed to dry in the air at room temperature for approximately five minutes. The coating was covered with a thin layer of 200-proof ethanol (Aaper Alcohol and Chemical Co., Shelbyville, Ky.), applied in drops via a pipette. The excess ethanol was removed by placing the coated glass slide in a convection oven at 100° C. for approximately 15 seconds. Metals were deposited sequentially on the coated glass slide by metal evaporation. Titanium was the first metal and it was supplied by heating using an electron beam in a vacuum chamber (less than 0.533 millipascal (4E-6 torr)) to deposit a layer of approximately 5 nanometers thick. A layer of gold having a thickness of approximately 60 nanometers was then deposited under the same conditions using the same vacuum chamber, by heating via high voltage thermal resistance in a tungsten boat. The chromonic coating and the exposed areas of the glass slide were thus coated with metal. The glass slide was then immersed in approximately 300 mL water that contained 8-10 drops of $NH_4OH$, which resulted in the chromonic coating being lifted off of the slides. Metal that had been deposited on exposed areas of the glass slide remained on the slide, while metal that had been deposited on chromonic coated areas of the slide lifted off. Atomic force microscopy (AFM) analysis showed an array of essentially parallel wires on the slide. The nanowires had a mean width of approximately 529 nanometers, and a mean pitch of approximately 2.9 micrometers.

Example 3

A mixture of corn starch (0.26 g; available as ICB 3000 from Tate & Lyle PLC, Decatur, Ill.) in deionized water (3.1 g) was magnetically stirred until the starch was dissolved. A solution of 30 weight percent ammonium hydroxide in water (1.06 g) was then added to the dissolved polysaccharide mixture, followed by folic acid dihydrate (0.5 g Alfa Aesar, Ward Hill, Mass.). Folic acid is a chromic material having the following structure.

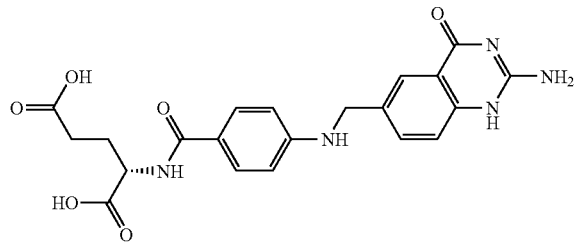

After the folic acid compound was dissolved, four drops of a 10 weight percent solution of GLUCOPON 425N in water (approximate weight 0.108 g, an alkyl polyglucoside surfactant available from Cognis Corp. USA, Cincinnati, Ohio) was combined with this solution. A portion of this mixture was then coated onto glass slides (50 mm×75 mm×1 mm) using a #2.5 wire wound drawdown bar (0.00635 mm coating thickness; available from UV Process Supply, Chicago, Ill.). The folic acid solution was applied to the glass slide using a pipette, and the drawdown bar was drawn over the surface of the slide to make a thin coating of the folic acid solution. The film of folic acid on the glass slide was allowed to dry in the air at room temperature for approximately five minutes. The coated glass slide was dip coated by into a glass chamber (0.74 cm×7.01 cm×7.73 cm), containing absolute 200-proof ethanol (Aaper Alcohol and Chemical Co., Shelbyville, Ky.) and held submerged for approximately five seconds. To remove excess ethanol, the slide was placed in a convection oven (Fischer, Model 230G, Hampton, N.H.), at 110° C. for approximately 15 seconds. Optical microscopy showed formation of essentially parallel channels oriented in the coating direction. Reactive ion etching was then performed using a YES G1000 Plasma Cleaning System (available from Yield Engineering Systems Inc. San Jose, Calif.) in the "RIE Mode Arrangement" with samples placed on the active electrode. The device was turned on for 2 minutes. Metals were deposited sequentially on the coated glass slide by metal evaporation. Titanium was the first metal and it was supplied by heating using an electron beam in a vacuum chamber (less than 0.533 millipascal (4E10-6 torr)) to deposit a layer of approximately 5 nanometers thick. A layer of gold having a thickness of approximately 60 nanometers was then deposited under the same conditions using the same vacuum chamber, by heating via high voltage thermal resistance in a tungsten boat. The chromonic coating and the exposed areas of the glass slide were thus coated with metal. The glass slide was then immersed in approximately 300 mL water that contained 8-10 drops of $NH_4OH$, which resulted in the folic acid coating being lifted off of the slides. Metal that had been deposited on exposed areas of the glass slide remained on the slide, while metal that had been deposited on folic acid coated areas of the slide lifted off. Optical microscopy revealed an array of essentially parallel metallic wires on the slide, with the wires having a width of 200-600 nm and a pitch of 2-10 micrometers.

Example 4

Sucrose (0.516 g) was added to deionized water and magnetically stirred until it was dissolved. Cromolyn sodium salt (1.0 g, from MP Biomedicals, Aurora, Ohio) was slowly added to the resulting, rapidly-stirred solution. Cromolyn salt is a chromonic material having the following structure.

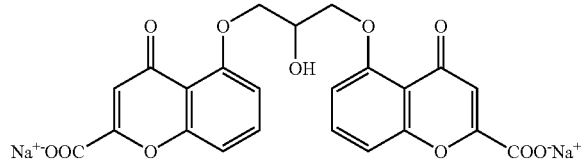

After the cromolyn sodium salt was dissolved, stirring speed was reduced, 10 weight percent aqueous solution of GLUCOPON 425N (0.11 g, an alkyl polyglucoside surfactant available from Cognis Corp. USA, Cincinnati, Ohio) added to this mixture. The resulting solution was transferred to a disposable syringe fitted with a 1.2 micron disposable syringe filter (25 mm diameter with a Versapore Membrane, a hydrophilic acrylic copolymer on a non-woven support available as product #4488 from Pall Corporation, East Hills, N.Y.) and filtered. The filtered solution was hand-coated onto glass slides (50 mm×75 mm×1 mm) using a #2.5 wire wound drawdown bar (available from UV Process Supply, Chicago, Ill.) by first affixing the slide at the top to a stationary platen using a short tab of SCOTCH #810 MAGIC TAPE (available from 3M Company, St. Paul, Minn.). The solution was applied to the glass slide applied in drops via a pipette, and the drawdown bar was hand-drawn over the surface of the slide. The resulting coating was allowed to dry in air at room temperature for approximately 30 minutes, after which the coated slide was dipped into a glass chamber (0.74 cm×7.01 cm×7.73 cm) containing 200-proof ethanol (Aaper Alcohol and Chemical Co., Shelbyville, Ky.) and held submerged for approximately five seconds, followed by drying in a convection oven (Fischer, Model 230G, Hampton, N.H.), heated to 110° C., for approximately 15 seconds. Optical microscopy of the coating revealed essentially parallel channels oriented in the coating direction. Reactive ion etching was performed using a YES G1000 Plasma Cleaning System (available from Yield Engineering Systems Inc. San Jose, Calif.) in the "RIE Mode Arrangement" with samples placed on the active electrode and exposed to oxygen plasma for 2 minutes. Metals were deposited sequentially on the coated glass slide by metal evaporation. Titanium was the first metal and it was supplied by heating using an electron beam in a vacuum chamber (less than 0.53 millipascal (4E-6 torr)) to deposit a layer of approximately 5 nanometers thick. A layer of gold having a thickness of approximately 60 nanometers was then deposited under the same conditions, in the same vacuum chamber, by heating via high voltage thermal resistance in a tungsten boat. The cromolyn coating and the exposed areas of the glass slide were thus coated with metal. The glass slide was then immersed in approximately 300 mL water that contained 8-10 drops of $NH_4OH$, which resulted in the cromolyn coating being lifted off of the slides. Metal that had been deposited on exposed areas of the glass slide remained on the slide, while metal that had been deposited on folic acid coated areas of the slide lifted off. Optical microscopy revealed an array of essentially parallel metallic wires on the slide, with the wires having a width of 200-600 nm and a pitch of 2-10 microns.

Example 5

A mixture of corn starch (0.26 g; available as ICB 3000 from Tate & Lyle PLC, Decatur, Ill.) in deionized water (4.0 g) was magnetically stirred until the starch dissolved. A solution of 30 weight percent ammonium hydroxide in water (0.14 g) was then added to the starch solution, followed by the chromonic compound of Formula IV prepared essentially by the method described in Example 4 of U.S. Pat. No. 5,998,487 (0.5 g), described above. After the chromonic compound was dissolved, four drops of a 10 weight percent solution of GLUCOPON 425N in water (an alkyl polyglucoside surfactant available from Cognis Corp. USA, Cincinnati, Ohio) were added to the solution using a pipette. The solution was then taken up in a 5-milliliter disposable syringe that was then fitted with a 5-micrometer ACRODISC syringe filter having a VERSAPORE membrane (available from Pall Corp., East Hills, N.Y.). The solution was discharged from the syringe through the syringe filter into a glass vial.

The filtered solution was coated onto a glass slide (50 mm×75 mm×1 mm, available from Corning Inc., Corning, N.Y.) using a Bird film applicator (0.0127 mm (0.0005 inch)) wet coating thickness, available from BYK-Gardner USA, Columbia, Md.) that was supported at each end by glass microscope slides that act as spacers. Onto one end of the coating slide was attached a short tab of SCOTCH MAGIC TRANSPARENT TAPE (available from 3M Company, St. Paul, Minn.), and this construction was positioned under the Bird film applicator, between the two supporting slides. The chromonic solution was applied to the coating slide adjacent to the Bird film applicator using a pipette, and the slide was pulled (by hand, using the tape tab) under the Bird film applicator. The chromonic coating on the glass slide was allowed to dry in air, at room temperature, for approximately ten minutes, followed by dip coating in absolute, 200-proof ethanol (Aaper Alcohol and Chemical Co., Shelbyville, Ky.) for five seconds. Excess ethanol was removed by placing the coated glass slide in a convection oven at 110° C. for approximately 15 seconds. This slide was treated by reactive ion etching using a YES G1000 Plasma Cleaning System (Yield Engineering Systems Inc. San Jose, Calif.) for one minute in an oxygen gas plasma environment. The slide containing the chromonic coating was placed on top of an active plate electrode with a ground plate electrode above it. The plasma chamber was then put under vacuum pressure of around 300 mtorr and purged with the gas species ($O_2$). Power output used was 500 watts, which creates the plasma. After the plasma cleaning process, the slide was transferred to a metal evaporation apparatus where metals were deposited sequentially on the coated glass slide. The first metal, Ti, was heated via electron beam in a vacuum chamber at a pressure of less than about 4.0E-6 torr. A layer of titanium having a thickness of approximately 5 nanometers (50 Angstroms) was deposited. Following the Ti layer, a layer of gold having a thickness of approximately 60 nanometers was deposited under similar conditions, in the same vacuum chamber, by heating via high voltage thermal resistance in a tungsten boat. The chromonic coating and the exposed areas of the glass slide were thus coated with metal. The glass slide was immersed in approximately 300 mL water that contained 8-10 drops of $NH_4OH$, which resulted in the chromonic coating lifting off of the slide. Metal that was deposited on exposed areas of the glass slide remained on the slide, and metal that was deposited on chromonic coated areas of the slide lifted off. The coating, metallization, and water washing processes described above were repeated using this nanowire-containing slide as the substrate. The coating direction was essentially orthogonal to the direction of the nanowires already present on the glass slide.

Optical microscopy showed a grid of metallic wires, with a top layer of wires oriented essentially orthogonal to the bottom layer. Analysis by optical microscopy showed that both sets of nanowires were approximately 300-400 nanometers in width, and had a pitch (the distance between nanowires) from about 2 to about 15 micrometers. Surface resistance measurements of this sample using a Delcom 717 non-contact conductance monitor (available from Delcom Instruments, Inc., Prescott, Wis.) gave a value of 23 ohms/square.

What is claimed is:

1. A method comprising:
    coating a substrate surface with a chromonic solution to form a chromonic layer, the chromonic solution comprising chromonic material and water;
    removing at least a portion of the water from the chromonic layer to form a dried chromonic layer; and
    exposing the dried chromonic layer to an organic solvent to form a pattern of channels within the dried chromonic layer.

2. A method according to claim 1 further comprising disposing a deposition material within the pattern of channels to form a pattern of nanostructures attached to the substrate surface.

3. A method according to claim 2 wherein the disposing step comprises disposing a metal within the pattern of channels to form a pattern of metal nanostructures attached to the substrate surface.

4. A method according to claim 2 further comprising cleaning the pattern of channels within the dried chromonic layer before the disposing step, and the cleaning comprises a plasma treatment.

5. A method according to claim 2 further comprising removing the dried chromonic layer from the substrate surface.

6. A method according to claim 5 wherein the removing step comprises dissolving the dried chromonic layer from the substrate surface with a solvent comprising water.

7. A method according to claim 1 wherein the exposing step comprises exposing the dried chromonic layer to a hydrophilic organic solvent to form a pattern of channels within the dried chromonic layer.

8. A method according to claim 1 wherein the exposing step comprises exposing the dried chromonic layer to an organic solvent, comprising an alcohol, to form a pattern of channels within the dried chromonic layer.

9. A method according to claim 1 wherein the exposing step comprises exposing the dried chromonic layer to an organic solvent, comprising a ketone, to form a pattern of channels within the dried chromonic layer.

10. A method according to claim 1 wherein the exposing step comprises exposing the dried chromonic layer to an organic solvent that does not dissolve the chromonic material, to form a pattern of channels within the dried chromonic layer.

11. A method according to claim 1 wherein the exposing step comprises exposing the dried chromonic layer to an organic solvent to form a pattern of channels having an average channel width in a range from 10 to 800 nanometers, within the dried chromonic layer.

12. A method according to claim 1 wherein the exposing step comprises exposing the dried chromonic layer to an organic solvent to form a pattern of channels having an average channel depth in a range from 500 nanometers to 3 micrometers, an average channel width in a range from 10 to 800 nanometers, and an average pitch or period in a range from 500 nanometers to 20 micrometers, within the dried chromonic layer.

13. A method according to claim 2 wherein the disposing step comprises disposing a deposition material within the pattern of channels to form a pattern of nanostructures having an average nanostructure width in a range from 10 to 800 nanometers.

14. A method according to claim 2 wherein the disposing step comprises disposing a metal within the pattern of channels to form a pattern of metal nanostructures having an average nanostructure height in a range from 10 to 250 nanometers, an average nanostructure width in a range from 10 to 800 nanometers, and an average pitch or period in a range from 500 nanometers to 20 micrometers.

15. The method of claim 1 wherein the pattern of channels comprises a plurality of parallel or substantially parallel channels.

16. The method of claim 1 wherein the coating step comprises coating a substrate surface with a chromonic solution to form a chromonic layer, the chromonic solution comprising chromonic material, a water soluble molecule and water, wherein the water soluble molecule forms a homogenous phase with the chromonic material and water.

17. The method of claim 1 wherein the exposing step comprises exposing the dried chromonic layer to a discontinuous organic solvent coating to form a corresponding discontinuous pattern of channels within the dried chromonic layer.

18. A method comprising:
coating a substrate surface with a first chromonic solution to form a first chromonic layer, the first chromonic solution comprising a first chromonic material and water;
removing at least a portion of the water from the first chromonic layer to form a first dried chromonic layer;
exposing the first dried chromonic layer to a first organic solvent to form a first pattern of channels within the first dried chromonic layer;
disposing a first deposition material within the first pattern of channels to form a first pattern of nanostructures;
removing the first dried chromonic layer from the substrate surface to form a first nanostructured substrate;
coating the first nanostructured substrate with a second chromonic solution to form second chromonic layer, the second chromonic solution comprising a second chromonic material and water;
removing at least a portion of the water from the second chromonic layer to form a second dried chromonic layer;
exposing the second dried chromonic layer to a second organic solvent to form a second pattern of channels within the second dried chromonic layer;
disposing a second deposition material within the second pattern of channels to form a second pattern of nanostructures; and
removing the second dried chromonic layer from the substrate surface to form a second nanostructured substrate.

19. A method according to claim 18 wherein the first pattern of channels comprises a first plurality of parallel or substantially parallel channels and the second pattern of channels comprises a second plurality of parallel or substantially parallel channels.

20. A method according to claim 19 wherein the disposing a first deposition material step comprises disposing the first deposition material within the first pattern of channels to form a first pattern of nanostructures having a first longitudinal orientation; and wherein the disposing a second deposition material step comprises disposing the second deposition material within the second pattern of channels to form a second pattern of nanostructures having a second longitudinal orientation and the second longitudinal orientation is parallel or substantially parallel to the first longitudinal orientation.

21. A method according to claim 19 wherein the disposing a first deposition material step comprises disposing the first deposition material within the first pattern of channels to form a first pattern of nanostructures having a first longitudinal orientation; and wherein the disposing a second deposition material step comprises disposing the second deposition material within the second pattern of channels to form a second pattern of nanostructures having a second longitudinal orientation and the second longitudinal orientation is non-parallel to the first longitudinal orientation.

22. A method according to claim 19 wherein the disposing a first deposition material step comprises disposing the first deposition material within the first pattern of channels to form a first pattern of nanostructures having a first longitudinal orientation; and wherein the disposing a second deposition material step comprises disposing the second deposition material within the second pattern of channels to form a second pattern of nanostructures having a second longitudinal orientation and the second longitudinal orientation is orthogonal or substantially orthogonal to the first longitudinal orientation.

23. A method according to claim 18 wherein the disposing a first deposition material step comprises disposing a first metal material within the first pattern of channels to form a first pattern of metal nanostructures having an average nanostructure height in a range from 10 to 250 nanometers, an average nanostructure width in a range from 10 to 800 nanometers, and an average pitch or period in a range from 500 nanometers to 20 micrometers, and wherein the disposing a second deposition material step comprises disposing a second metal material within the second pattern of channels to form a second pattern of metal nanostructures having an average nanostructure height in a range from 10 to 250 nanometers, an average nanostructure width in a range from 10 to 800 nanometers, and an average pitch or period in a range from 500 nanometers to 20 micrometers.

* * * * *

UNITED STATES PATENT AND TRADEMARK OFFICE
CERTIFICATE OF CORRECTION

| | | |
|---|---|---|
| PATENT NO. | : 7,815,971 B2 | |
| APPLICATION NO. | : 11/626456 | |
| DATED | : October 19, 2010 | |
| INVENTOR(S) | : Wayne S. Mahoney | |

It is certified that error appears in the above-identified patent and that said Letters Patent is hereby corrected as shown below:

Column 2

Line 4; Delete "Assemblly" and insert -- Assembly --, therefor.

Column 3

Line 31; Delete "hexaaryltryphenylene," and insert -- hexaaryltriphenylene, --, therefor.

Line 36; Delete "nonpolymeric" and insert -- non-polymeric --, therefor.

Column 5 – (Structure V)

Line 11-18; Delete "  " and insert -- 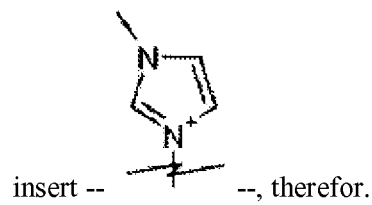 --, therefor.

Signed and Sealed this
Twenty-ninth Day of March, 2011

David J. Kappos
*Director of the United States Patent and Trademark Office*

UNITED STATES PATENT AND TRADEMARK OFFICE
CERTIFICATE OF CORRECTION

PATENT NO. : 7,815,971 B2  Page 1 of 1
APPLICATION NO. : 11/626456
DATED : October 19, 2010
INVENTOR(S) : Wayne S Mahoney It is certified that error appears in the above-identified patent and that said Letters Patent is hereby corrected as shown below:

Column 15

Line 51-63; Delete " 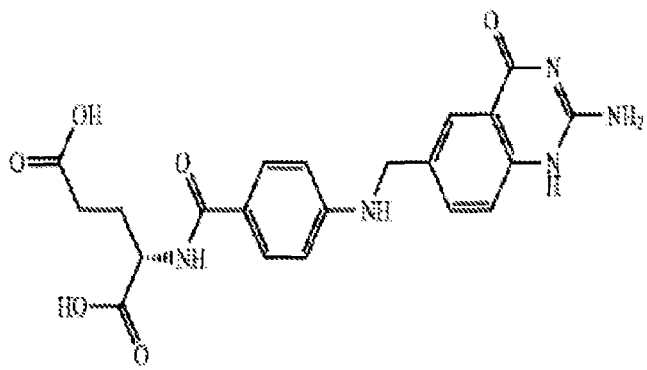 " and insert

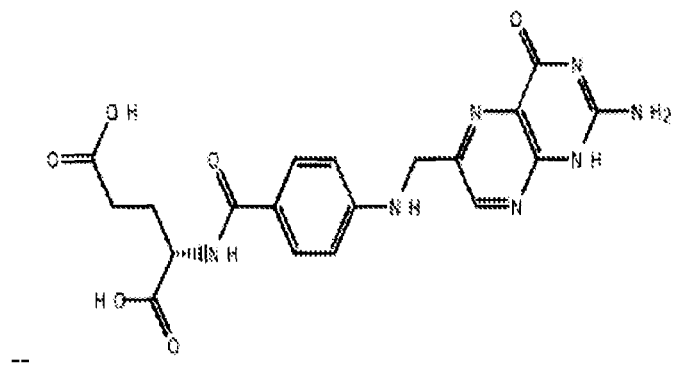 -- therefore.

Signed and Sealed this
Third Day of May, 2011

David J. Kappos
*Director of the United States Patent and Trademark Office*